(12) United States Patent
Yang et al.

(10) Patent No.: US 6,531,415 B1
(45) Date of Patent: Mar. 11, 2003

(54) SILICON NITRIDE FURNACE TUBE LOW TEMPERATURE CYCLE PURGE FOR ATTENUATED PARTICLE FORMATION

(75) Inventors: Wan-Cheng Yang, Jubei (TW); Ren-Dou Lee, Junghe (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/060,482

(22) Filed: Jan. 30, 2002

(51) Int. Cl.$^7$ .................. H01L 21/31; H01L 21/469
(52) U.S. Cl. ........................... 438/794; 438/791
(58) Field of Search ................. 438/758, 791, 438/794

(56) References Cited

U.S. PATENT DOCUMENTS

| | | | |
|---|---|---|---|
| 4,402,997 A | 9/1983 | Hogan et al. | 427/94 |
| 4,699,825 A | 10/1987 | Sakai et al. | 428/337 |
| 5,032,545 A | 7/1991 | Doan et al. | 437/242 |
| 5,468,688 A | 11/1995 | Kohl et al. | 437/237 |
| 5,536,330 A | 7/1996 | Chen et al. | 134/21 |
| 5,756,404 A * | 5/1998 | Friedenreich et al. | 438/791 |
| 5,904,567 A | 5/1999 | Yamazaki | 438/689 |
| 5,939,333 A | 8/1999 | Hurley et al. | 437/241 |

* cited by examiner

*Primary Examiner*—Alexander Ghyka
(74) *Attorney, Agent, or Firm*—George O. Saile; Stephen B. Ackerman; Stephen G. Stanton

(57) ABSTRACT

A method for forming upon a substrate employed within a microelectronics fabrication a silicon nitride dielectric layer with attenuated defects and inhomogeneities. There is provided one or more substrates. There is then provided a reactor tube which is part of an apparatus suitable for providing various gases at elevated temperatures. There is then purged the reactor tube with an inert gas in a low temperature cycle purge (LTCP) step at a temperature below deposition temperature. There is then placed the substrate(s) within a reactor tube. There is then deposited a silicon nitride dielectric layer upon the substrate(s), employing silane and ammonia gases employing a low pressure chemical vapor deposition (LPCVD) method. There is then purged the reaction tube at a temperature below the deposition temperature, followed by removal of the substrate carrier with attenuated formation of particulates and inhomogeneities within and about the silicon nitride layer and reaction tube.

14 Claims, 4 Drawing Sheets

SILICON NITRIDE FURNACE TUBE LOW TEMPERATURE CYCLE PURGE FOR ATTENUATED PARTICLE FORMATION

BACKGROUND OF THE INVENTION

1. Field of the Invention

The present invention, relates to the field of microelectronics fabrication. More particularly, the present invention relates to the field of silicon nitride dielectric layers employed within integrated circuit microelectronics fabrications.

2. Description of their Related Art

Microelectronics fabrications employ several different kinds of microelectronics materials, with both patterned and blanket layers being required to embody the various functions which such devices may be required to perform. Among the most widely employed materials are dielectrics, which are formed ranging from extremely thin layers as in field effect transistor (FET) device gate insulation layers to layers of several microns thickness for device passivation and encapsulation. Among the most frequently employed dielectric materials are silicon containing dielectric materials, which are highly stable and readily formed controllably to the general needs of microelectronics fabrication.

Among the silicon containing dielectric materials which are widely employed in microelectronics fabrications, silicon nitride (whose stoichiometric formula is $Si_3N_4$ but may be formed over a wide range of Si—N composition) is especially useful as an etch mask and etch stop layer due to its chemical inertness and physical stability. For example, the hardness of silicon nitride layers is superior to practically all other commonly employed inorganic dielectric materials. The amorphous glassy nature of conventional silicon nitride material make it useful for forming homogeneous layers over complex topography without undue concern for anisotropic behaviour with respect to stress, cracking and so forth.

Silicon nitride layers are generally formed by chemical vapor deposition (CVD) at an elevated temperature from reactive gases which act as sources for silicon and nitrogen. Such CVD methods may employ a range of temperatures for thermal activation and may employ additional excitation from energetic sources such as electrical plasmas, ions and other energetic media. In addition, it is common to operate such deposition processes at low pressures substantially below normal atmospheric pressure, in which case the process is more properly described as a low pressure chemical vapor deposition (LPCVD) method. Systems for deposition of such dielectric layers as silicon nitride and the like at elevated are commonly referred to as "furnaces", but in practice the commonly employed configuration is that of a cylindrical reactor vessel or tube containing the objects to be covered, temperature and gas environment controls. While generally satisfactory for employment in microelectronics fabrication, silicon nitride layers formed employing LPCVD methods in reactor tubes are not without problems.

For instance, it is highly desirable to minimize particulate formation and other inhomogeneities within or about the silicon nitride layers as these may constitute defects in the microelectronics fabrication. It is also important to assure uniformity of thickness, composition, properties, etc. over the entire extent of the substrate or batch of substrates, placed within the reactor tube, which are to be employed within the manufacture of microelectronics fabrications.

It is thus towards the coal of forming upon a substrate employed within a microelectronics fabrication a silicon nitride dielectric layer with attenuated defects and inhomogeneities that the present invention is generally directed.

Various methods have been disclosed for forming a silicon nitride layer employing chemical vapor deposition (CVD) method within a microelectronics fabrication with improved properties.

For example, Hogan et al., in U.S. Pat. No. 4,402,997, disclose a method for forming silicon nitride layers on substrate wafers without streaks. The method employs flowing oxygen gas through the deposition tube between deposition of silicon nitride layers on groups of substrate waters.

Further, Sakai et al., in U.S. Pat. No. 4,699,825, disclose a method for forming silicon nitride film over large wafers with uniformity, high yield, good quality without decreasing film-forming efficiency. The method employs a pressure range of 0.05 to about 0.25 Torr and a temperature range of 700 to 1000° C. for the reaction between silage and ammonia.

Still further, Doan et al., in U.S. Pat. No. 5,032,545, disclose a method for forming silicon nitride layers on silicon substrates which are free of any native surface silicon oxide layer. The method employs a first treatment of the silicon substrate in a rapid thermal processor in an oxidant-free environment to form a thin layer of silicon nitride on a native silicon oxide-free surface, followed by transfer to a conventional silicon nitride furnace where the thin silicon nitride layer may be increased to any desired thickness Yet further, Kohl et al., in U.S. Pat. No. 5,468,688, disclose a method for forming nitride films on various substrates at low temperatures and near atmospheric pressure. The method employs hydrazine vapor as the source of nitrogen to react with the substrate surface to from the nitride layer.

Still yet further, Chen et al., in U.S. Pat. No. 5,536,330, disclose a method for purging a reactor chamber employed within fabrication of integrated circuit structures wherein a high vacuum is required. The method employs a purge of the system with an inert gas such as argon performed at a temperature of at least 90 degrees centigrade, followed by evacuating the still-heated system to a pareeure of about 5E(-7) Torr to test for leaks before employment.

Yet further still, Friedenreich et al., in U.S. Pat. No. 5,756,404, disclose a method for forming nitride layers on semiconductor integrated circuit substrates in a processing chamber. The method employs a two-step deposition process with a pumping-out of the reactor chamber between the first and second deposition steps.

Yet still further, Yamazaki et al., in U.S. Pat. No. 5,904,567, disclose a method for forming insulating films on substrates with attenuated process problems such as film uniformity and build-up on apparatus and observation ports. The method employs forming the desired layer in a two-step process wherein the second step utilizes a reactive gas to form a layer comprising the first layer and the reactive gas, followed by introducing a cleaning gas including nitrogen trifluride into the chamber.

Finally, Hurley et al., in U.S. Pat. No. 5,939,333, disclose a method for forming silicon nitride layers with improved properties on a substrate surface. The method employs a three-step process of forming first at least a monolayer of silicon on a surface, followed by forming a layer of silicon nitride. The surface of a silicon substrate may also be directly nitridated employing dimethylhydrazine, followed by formation of the remaining silicon nitride layer.

Desirable in the art of microelectronics fabrication are additional methods for forming silicon nitride layers employing chemical vapor deposition (CVD) with improved properties and attenuated defects. It is towards these goals that the present invention is generally and specifically directed.

SUMMARY OF THE INVENTION

A first object of the present invention is to provide a method for forming upon a substrate employed within a microelectronics fabrication a silicon nitride dielectric layer with attenuated defects and inhomogeneities.

A second object of the present invention is to provide a method in accord with the first object of the present invention, where a silicon nitride dielectric layer is formed, upon one or more semiconductor substrates employed within an integrated circuit microelectronics fabrication, employing low pressure chemical vapor deposition (LPCVD), with attenuated formation within and about the silicon nitride dielectric layer of particulates or imhomogeneities.

A third object of the present invention is to provide a method in accord with the first object of the present invention and the second object of the present invention, where the method is readily commercially implemented.

In accord with the objects of the present invention, there is provided a method for forming upon a substrate employed within a microelectronics fabrication a silicon nitride dielectric layer with attenuated defects and inhomogeneities. To practice the invention, there is provided one or more substrates. There is then provided a reactor tube which is part of a system for providing various reactive gases at elevated temperatures. There is then purged the reactor tube with an inert gas in a low temperature charge-purge (LTCP) cycle at a temperature below deposition temperature. There is then placed the substrate(s) in a holder within the reactor tube. There is then deposited a silicon nitride dielectric layer upon the substrate(s) within the reactor tube employing silane and ammonia gases in a low pressure chemical vapor deposition (LPCVD) process at a temperature of from about 750 to about 780 degrees centigrade, followed by substrate carrier removal, resulting in attenuated formation of particulates and inhomogeneities within and about the silicon nitride dielectric layer and reaction tube.

The present invention may be practiced on substrates employed within microelectronics fabrications selected from the group consisting of integrated circuit microelectronics fabrications, charge coupled device microelectronics fabrications, solar cell microelectronics fabrications, optoelectronics microelectronics fabrications, ceramic substrate microelectronics fabrications and flat panel display microelectronics fabrications.

The present invention employs methods and materials as are known in the art of microelectronics fabrications, but in a novel order and sequence. Thus the method of the present is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiments is understood within the context of the accompanying drawings, which form a material part of this disclosure, wherein.

DESCRIPTION OF THE PREFERRED EMBODIMENT

The present invention provides a method for forming upon a substrate employed within a microelectronics fabrication a silicon nitride dielectric layer deposited employing low pressure chemical vapor deposition (LPCVD) with attenuated particulates and inhomogeneities formed during deposition.

Figure 1:
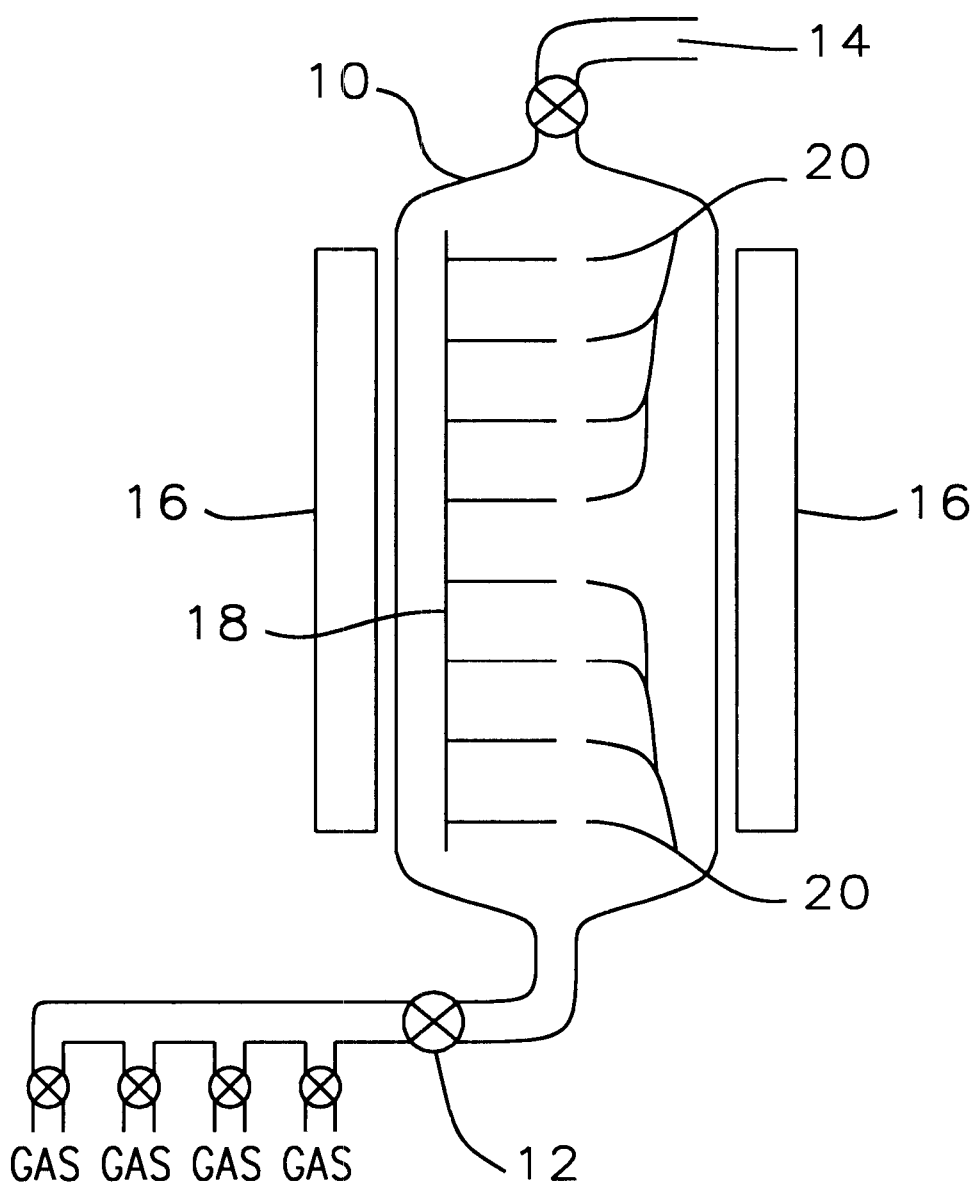
FIG. 1 is a schematic diagram of the silicon nitride deposition apparatus

Referring now to FIG. 1 to FIG. 4, there is shown in FIG. 1 a schematic diagram illustrating the apparatus, system and general principles employed in formation upon one or more substrates a silicon nitride dielectric layer in accord with the general embodiment of the present.

Shown in FIG. 1 is a reactor tube 10 to which are connected manifolds for gas supply 12 and evacuation via vacuum pumps 14. The temperature of the reactor is controlled by means of heating apparatus 16. A boat 18 containing one or more substrates 20 may be inserted and removed from the reactor tube as desired.

With respect to the reactor tube 10 shown in FIG. 1, the reactor tube 10 is formed of extremely durable and inert material to enable the formation within upon objects contained therein of various layers from reactive gases, supplied under conditions of precise control of temperature, pressure and other operating parameters to ensure adequate process control of layer properties. Preferably the reactor tube is vertically oriented with respect to the gas flow and substrate location With respect to the gas manifold 12 shown in FIG. 1, the gas manifold 12 provides controlled amounts of various gases required for the particular process being performed. Methods and materials for such gas manifolds are well known in the art of microelectronics fabrication.

With respect to the vacuum pumping system 14 shown in FIG. 1, the vacuum pumping system is a commonly employed system as is well known in the art of microelectronics fabrication.

With respect to the heating and temperature control system 16 shown in FIG. 1, the heating and temperature control system 16 are well known and practiced in the art of microelectronics fabrication.

With respect to the substrate carrier 18 and substrate(s) 20 shown in FIG. 1, the substrates carrier 18 and substrate(s) are known in the art of microelectronics fabrication. Preferably, the substrate carrier 18 is formed employing an inert material such as fused quartz or silica for use with substrates such as, for example, silicon semiconductor wafers.

Figure 2:
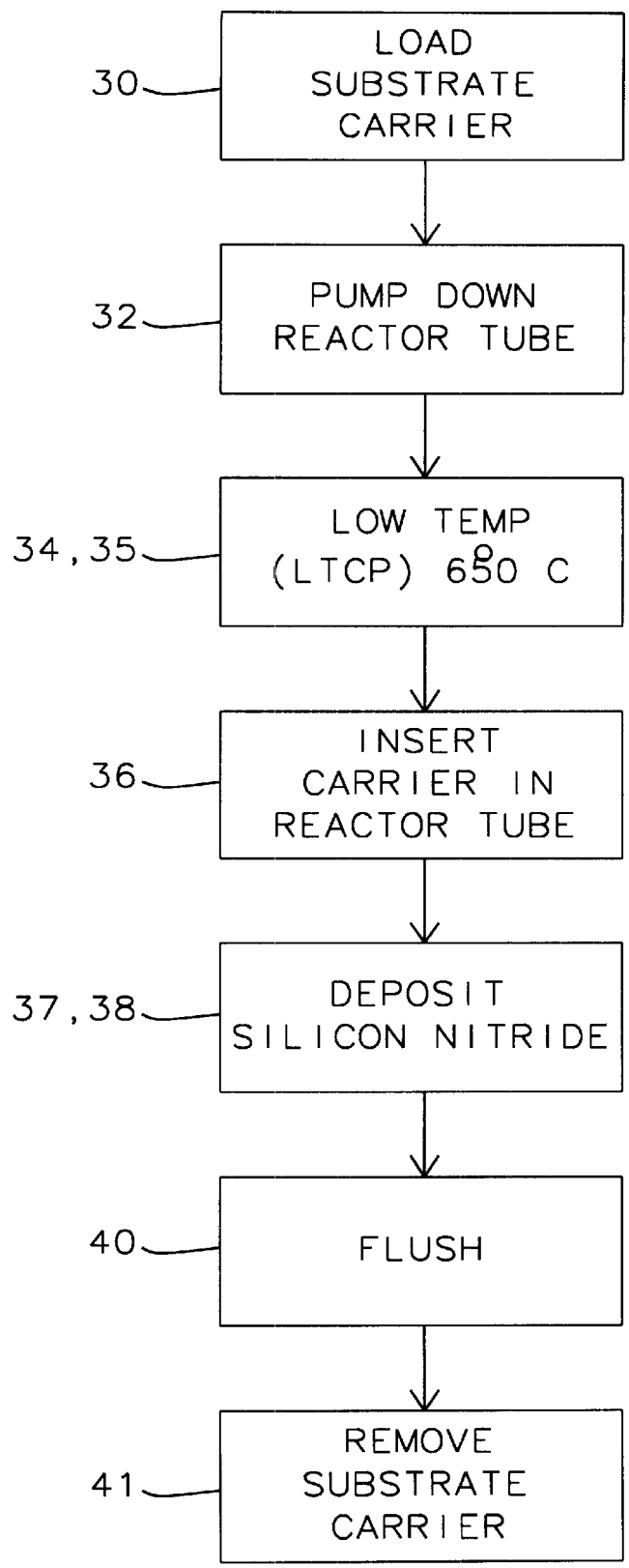
FIG. 2 is a flow chart diagram of the process of the present invention.

Referring now more particularly to FIG. 2, there is shown a flow chart diagram illustrating the method of the present invention. The silicon nitride dielectric layers are formed upon one or more substrates employing the following multi-step process: (1) loading a carrier boat with the substrate(s) 30; (2) evacuating the reactor tube 34; (3) bringing the reactor tube and to a temperature below the deposition temperature 35; (4) flushing with an inert gas to purge the reactor tube 36; (5) inserting the loaded boat into the reactor tube 32; (6) bringing the reactor tube and boat to the temperature range for silicon nitride deposition 37; (7) introducing reactant gas/vapor and forming silicon nitride dielectric layer 38; (8) lowering temperature of reactor tube and boat to below deposition temperature range 39; (9) removing the boat from the reactor tube 41.

With respect to the substrate carrier boat, the substrates may be substrates employed within microelectronics fabrications, such as, for example, silicon semiconductor wafers. Such substrate carriers are commonly known and employed in the art of microelectronics fabrication. The insertion of the loaded boat into the reactor tube is commonly done taking routine precautions to exclude contamination while the loaded boat is placed in position. Whilst positioning the substrate carrier boat in position the reactor tube is evacuated to remove background gases in preparation for the deposition process.

After evacuation of the reactor tube to a pressure of less than about 25 pascals, the temperature is brought to about 650 degrees centigrade and a purge step employing nitrogen gas at a flow rate of about 3 standard liters (sl) per minute: performed for about 30 minutes which constitutes a low temperature cycle purge (LTCP) process. Preferably the LTCP process temperature is from about 50 to 100 degrees below the deposition temperature.

With respect to the formation of silicon nitride dielectric layer, the low pressure chemical vapor deposition (LPCVD) method involves the following process steps: (1) temperature of from about 750 to 780 degrees centigrade; (2) reactant gases silane ($SiH_4$) and ammonia ($NH_3$).

Following the deposition of silicon nitride dielectric layer, the reactor tube temperature is lowered to about 650 degrees centigrade. The substrates are then removed from the reactor tube.

With respect to removing the substrate carrier boat from the reactor tube, the substrate carrier boat is reduced to an appropriate temperature for handling and normal procedures are employed as are known in the art of microelectronics fabrication to minimize contamination and damage.

Figure 3:
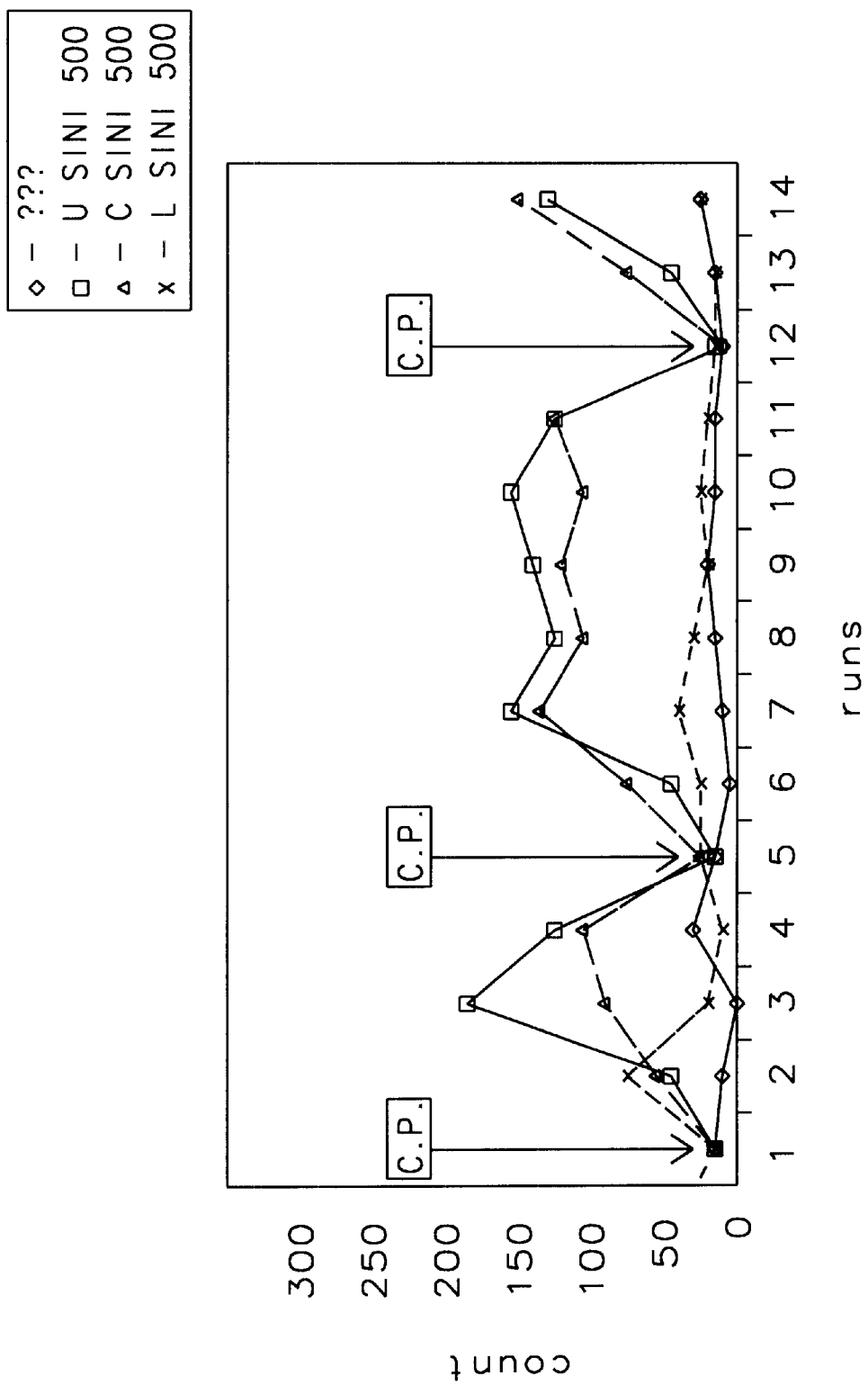
FIG. 3 and FIG. 4 are graphs showing the number of particles detected within the furnace tube before and after the purge process.
Figure 4:
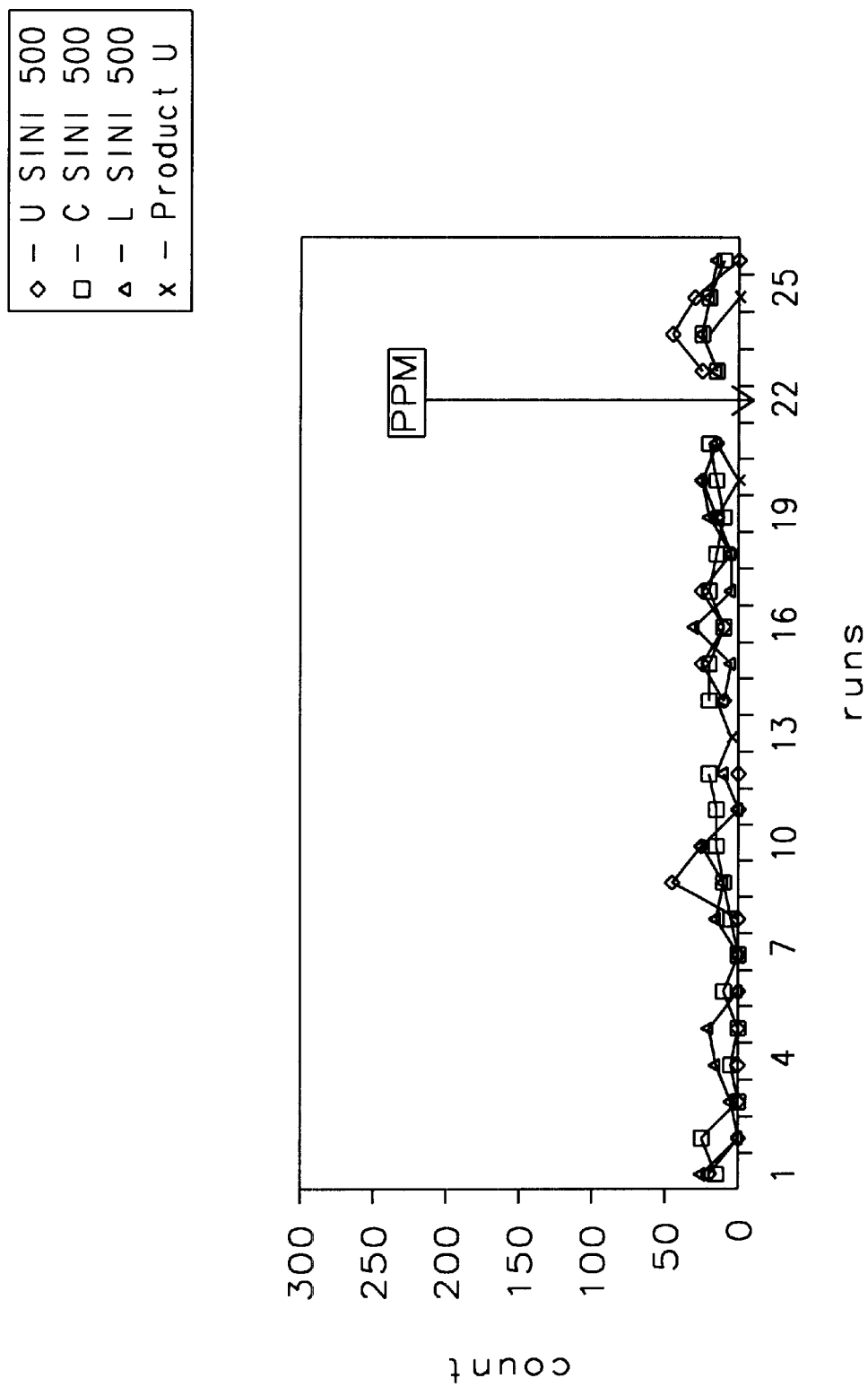

Referring now more particularly to FIG. 3 and FIG. 4, there are shown a pair of graphs illustrating the amount of particulates formed during the deposition of a silicon nitride layer in accord with the prior art (FIG. 3) and the amount of particulates formed during deposition of a silicon nitride layer in accord with the present invention (FIG. 4).

Experimental

The benefits and advantages of the present invention is illustrated by the results of measurements of particulates formed during deposition of silicon nitride dielectric layers in accord with the present invention. The amount of particulates within the reaction chamber tube was first (LTCP) before the deposition of silicon nitride. The results are shown in FIG. 3. The amount of particulates is variable from location to location within the reactor tube and from one run to another as seen in FIG. 3. The particulates have a size of about 0.5 micron.

The same system was then employed for a series of deposition runs forming silicon nitride layers upon substrates in accord with the present invention, employing a low temperature cycle purge (LTCP) prior to deposition of silicon nitride. The amount of particulates was invention are greatly reduced compared to the conventional method. Additionally, the size of particulates formed employing the present invention was found to be below about 0.2 micron.

The present invention provides a method for forming silicon nitride layers upon one or more substrates employed within a microelectronics fabrication employing low pressure chemical vapor deposition (LPCVD), where there is attenuated particulates formed within and about the silicon nitride layers and substrates and inhomogeneities by performing a low temperature cycle purge step before and after the deposition of silicon nitride dielectric layer.

As is understood by a person skilled in the art, the general embodiment of the present invention is illustrative of the present invention rather than limiting of the present invention. Revisions and modifications may be made to materials, structures and dimensions through which is provided the preferred embodiment of the present invention while still providing embodiments of the present invention which are within the spirit and scope of the present invention, as defined by the appended claims.

What is claimed is:

1. A method for forming upon a substrate employed within a microelectronics fabrication a silicon nitride dielectric layer with attenuated defects comprising, sequentially:

providing one or more substrates;

providing a reactor tube and system for providing various reactive gases at elevated temperatures;

purging the reactor tube with an inert gas in a low temperature cycle purge (LTCP) at a temperature below reaction temperature;

placing the substrate in a boat and loading the boat into the reactor tube;

increasing the temperature to deposition temperature;

admitting reactive gases to the reactor tube and depositing silicon nitride dielectric layer;

reducing the temperature and purging the reactor tube employing nitrogen gas; and removing the substrate from the reactor tube.

2. The method of claim 1 wherein there has been attenuated the formation of particulates and inhomogeneities within and about the silicon nitride layer and reactor tube during and after silicon nitride dielectric layer deposition.

3. the method of claim 1 where the substrate is employed within a microelectronics fabrication chosen from the group containing:

integrated circuit microelectronics fabrications;

charge coupled device microelectronics fabrications;

solar cell microelectronics fabrications;

optoelectronics fabrications;

ceramic substrate microelectronics fabrications; and flat panel display microelectronics fabrications.

4. The method of claim 1 wherein the substrate is a silicon semiconductor substrate.

5. The method of claim 1 wherein the inert gas employed in LTCP step is nitrogen.

6. The method of claim 1 wherein the silicon nitride dielectric layer is formed employing a low pressure chemical vapor deposition (LPCVD) method.

7. The method of claim 1 wherein the reactive gases silane and ammonia and carrier gas are employed to form a silicon nitride dielectric layer.

8. The method of claim 1 wherein the silicon nitride dielectric layer is formed employing a temperature of from about 750 to about 780 degrees centigrade.

9. The method of claim 1 wherein the total pressure of the reactive gases within the reactor tube during silicon nitride layer formation is from about 25 to about 35 pascals.

10. A method for forming upon one or more semiconductor substrate wafers employed within an integrated circuit microelectronics fabrication a silicon nitride dielectric layer employing a low pressure chemical vapor deposition (LPCVD) method with attenuated formation of particulates and inhomogeneities comprising:

providing one or more semiconductor substrate wafers;

providing a reactor tube and system for providing various reactive gases at elevated temperatures;

loading the substrate wafer(s) into a wafer boat;

purging the reactor tube at a temperature below the reaction temperature employing nitrogen gas in a low temperature cycle purge (LTCP) step;

inserting the loaded wafer boat into the reactor tube;

evacuating the reactor tube;

elevating the temperature to from about 750 to about 780 degrees centigrade;

admitting silane and ammonia reactive gases and forming a silicon nitride dielectric layer;

reducing temperature to below the deposition temperature range;

purging the reactor tube employing nitrogen gas; and removing the wafer boat from the reactor tube.

11. The method of claim 10 wherein there is attenuated the formation of particulates within and around the silicon nitride layer and the reactor tube and inhomogeneities within the silicon nitride dielectric layer.

12. The method of claim 10 wherein the semiconductor substrate wafer(s) is a silicon semiconductor substrate wafer.

13. The method of claim 10 wherein the low temperature cycle purge (LTCP) steps are done at a temperature of about 650 degrees centigrade for a period of about 30 minutes.

14. The method of claim 10 wherein the low temperature chemical vapor deposition (LPCVD) process for forming silicon nitride dielectric layer employs reactive gasses comprising:

silane ($SiH_4$); and ammonia ($NH_3$).

* * * * *